(12) United States Patent
Kim et al.

(10) Patent No.: US 8,421,982 B2
(45) Date of Patent: Apr. 16, 2013

(54) DISPLAY SUBSTRATE, METHOD OF MANUFACTURING THE DISPLAY SUBSTRATE AND DISPLAY APPARATUS HAVING THE DISPLAY SUBSTRATE

(75) Inventors: Hee-Joon Kim, Cheonan-si (KR); Jeong-Eun Kim, Asan-si (KR)

(73) Assignee: Samsung Display Co., Ltd. (KR)

( * ) Notice: Subject to any disclaimer, the term of this patent is extended or adjusted under 35 U.S.C. 154(b) by 385 days.

(21) Appl. No.: 12/821,021

(22) Filed: Jun. 22, 2010

(65) Prior Publication Data

US 2011/0090445 A1 Apr. 21, 2011

(30) Foreign Application Priority Data

Oct. 19, 2009 (KR) ......................... 10-2009-0099440

(51) Int. Cl.
*G02F 1/1339* (2006.01)
(52) U.S. Cl.
USPC .......................................... 349/153; 349/190
(58) Field of Classification Search .................. None
See application file for complete search history.

(56) References Cited

U.S. PATENT DOCUMENTS

| | | | |
|---|---|---|---|
| 6,943,859 B2 | 9/2005 | Yoo et al. | |
| 200 /0 58599 | 7/2006 | Kao | |
| 2007/0184612 A1 | 8/2007 | Chan et al. | |
| 2008/0158493 A1* | 7/2008 | Park | 349/139 |
| 2010/0045916 A1* | 2/2010 | Kim et al. | 349/138 |

FOREIGN PATENT DOCUMENTS

| | | |
|---|---|---|
| JP | 08-015727 A | 1/1996 |
| JP | 09-244045 A | 9/1997 |
| JP | 10-161152 A | 6/1998 |
| JP | 2001-255546 A | 9/2001 |
| JP | 2009-031362 A | 2/2009 |
| KR | 1020020063424 A | 8/2002 |
| KR | 1020030032736 A | 4/2003 |
| KR | 1020040035181 A | 4/2004 |
| KR | 1020070037073 A | 4/2007 |
| KR | 1020070081033 A | 8/2007 |
| KR | 1020080077831 A | 8/2008 |
| KR | 1020080080740 A | 9/2008 |

\* cited by examiner

*Primary Examiner* — Thanh-Nhan P Nguyen
(74) *Attorney, Agent, or Firm* — Innovation Counsel LLP

(57) ABSTRACT

A display substrate includes a pixel, an organic layer and a shorting pad structure. The pixel electrode is arranged at a display area of a base substrate, and the pixel electrode is electrically connected to a transistor connected to a gate line and data line. The organic layer is arranged at the base substrate, and the organic layer is arranged between the transistor and the pixel electrode. The shorting pad structure is disposed at a peripheral area of the display area, and the shorting pad structure includes a first pad electrode at a lower height, a second pad electrode at a higher height, and a first height compensation pattern interposed between the first and second pad electrodes. A contact hole is defined through the organic layer so that second pad electrode can be electrically connected there through to the first pad electrode.

19 Claims, 12 Drawing Sheets

DISPLAY SUBSTRATE, METHOD OF MANUFACTURING THE DISPLAY SUBSTRATE AND DISPLAY APPARATUS HAVING THE DISPLAY SUBSTRATE

PRIORITY STATEMENT

This application claims priority under 35 U.S.C. §119 of Korean Patent Application No. 2009-99440, filed on Oct. 19, 2009 in the Korean Intellectual Property Office (KIPO), the contents of which application are herein incorporated by reference in their entirety.

BACKGROUND

1. Field of Disclosure

Example embodiments of the present disclosure of invention relate to a display substrate, a method of manufacturing the display substrate and a display apparatus having the display substrate. More particularly, example embodiments relate to a display substrate enhancing reliability, a method of manufacturing the display substrate and a display apparatus having the display substrate.

2. Description of Related Technology

Generally, a liquid crystal display (LCD) apparatus has an LCD panel and a backlight assembly providing light to the LCD panel. The LCD panel includes an array substrate, a color filter substrate opposite to the array substrate and a liquid crystal layer disposed between the array substrate and the color filter substrate. A gate line, a data line, a thin-film transistor (TFT) and a pixel electrode are typically arranged on the array substrate. A common electrode opposite to the pixel electrode is typically arranged on the color filter substrate.

The array substrate receives electrical signals supplied from an external apparatus and uses these to drive respective gate lines, data lines, TFTs and pixel electrodes provided on the array substrate.

Often, some of the electrical signals are transmitted to the common electrode through connections provided on the array substrate. For example, the array substrate may include one or more pads receiving a common voltage that is to be applied to the common electrode and the array substrate may include one or more shorting protrusions or pads structured to apply the supplied common voltage to the common electrode of the color filter substrate. The shorting protrusions/pads and the common electrode of the color filter substrate are electrically shorted to one another and thus the common voltage is applied to the common electrode of the color filter substrate.

SUMMARY

According to an aspect of the present disclosure, a display substrate includes a pixel electrode, an organic layer and a substantially planarized shorting pad structure. The pixel electrode is disposed in a display area of a base substrate and electrically connected to a transistor connected to a gate line and a data line. The organic layer is disposed on the base substrate and disposed between the transistor and the pixel electrode. The shorting pad structure is disposed in a peripheral region of the display area and includes a first pad electrode including a metal layer, a first height compensation pattern disposed on the pad electrode in a pad hole area, where the pad hole is formed through the organic layer. The shorting pad structure further includes a second pad electrode electrically connected to the first pad electrode through a contact hole formed at an area exposed by the first compensation pattern. The second pad electrode extends over the tops of the height of the planarized compensation pattern so as to be disposed at a predetermined distance below the overlying common electrode.

According to another aspect of the present disclosure, a method of manufacturing a display substrate includes forming a transistor in a display area of a base substrate and a first pad electrode of a shorting pad structure in a peripheral region surrounding the display area. A first compensation pattern is formed on the first pad electrode. An organic layer is formed on the base substrate on which the transistor is formed. The organic layer has a pad hole formed through the organic layer and corresponds to the first pad electrode. A pixel electrode is formed on the organic layer and connected to the transistor, and a second pad electrode is formed on the first compensation pattern and connected to the first pad electrode through a contact hole. The contact hole is formed at an area exposed by the first compensation pattern.

According to another aspect of the present disclosure, a display apparatus includes a display substrate, a counter substrate and a conductive sealant. The display substrate includes an organic layer disposed on a base substrate and disposed between a transistor and a pixel electrode which are formed on the base substrate, a shorting pad structure including a first pad electrode including a metal layer, a first height compensation pattern disposed on the pad electrode in a pad hole, the pad hole formed through the organic layer and a second pad electrode electrically connected to the first pad electrode through a contact hole formed at an area exposed by the first compensation pattern. The counter substrate faces the display substrate and includes a common electrode. The conductive sealant includes a conductive ball electrically connecting the shorting pad structure with the common electrode and combines the display substrate with the counter substrate.

According to the present disclosure, planarization of a shorting pad structure is improved by including a height compensation pattern under a top electrode of the shorting pad structure, thereby preventing open circuit defect between a shorting pad of display substrate and a common electrode of a counter substrate. Thus, reliability of the display apparatus may be enhanced.

BRIEF DESCRIPTION OF THE DRAWINGS

The above and other features and advantages of the present disclosure will become more apparent by describing in detailed example embodiments thereof with reference to the accompanying drawings, in which.

DETAILED DESCRIPTION

Figure 1:
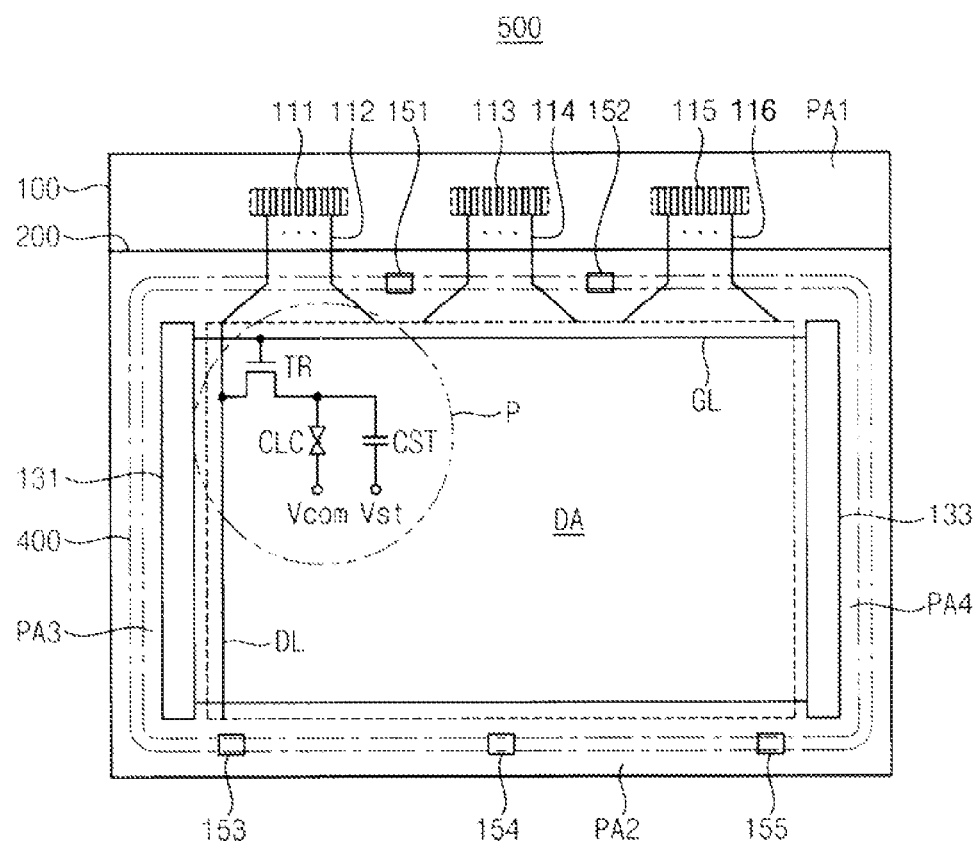
FIG. 1 is a plan view illustrating a display apparatus according to an example embodiment.

Embodiments in accordance with the present disclosure are described more fully hereinafter with reference to the accompanying drawings. The present teachings may, however, be embodied in many different forms and should not be construed as limited to the example embodiments set forth herein. Rather, these example embodiments are provided so that this disclosure will be thorough and complete, and will fully convey the scope of the present teachings to those skilled in the pertinent art. In the drawings, the sizes and relative sizes of layers and regions may be exaggerated for clarity.

It will be understood that when an element or layer is referred to as being "on," "connected to" or "coupled to" another element or layer, it may directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein interpreted accordingly.

The terminology used herein is for the purpose of describing particular example embodiments only and is not intended to be limiting of the present teachings. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of an apparatus and are not intended to limit the scope of the present disclosure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view illustrating a display apparatus 500 according to a first example embodiment of the present disclosure.

Referring to FIG. 1, the display apparatus 500 includes a display substrate 100 (also known as a TFT array substrate), a counter substrate 200 (also known as a common electrode substrate) overlying the first recited substrate and an electrically conductive sealant 400 that forms a substantially closed boundary for a space between the upper and lower substrates and that thereby helps to contain a liquid crystal material disposed between the upper and lower substrates.

The display substrate 100 includes a display area DA and a plurality of peripheral areas PA1, PA2, PA3 and PA4 surrounding the display area DA.

The display area DA includes a plurality of gate lines GL extending in a first direction, a plurality of data lines DL extending in a second direction so as to cross with the gate lines GL and a plurality of pixel units P each electrically connected to a crossing pair of the gate lines GL and the data lines DL. The pixel unit P (only one shown) includes a transistor TR connected to the corresponding gate line GL and data line DL, a pixel electrode that defines one plate of a liquid crystal capacitor CLC, where the pixel-electrode is electrically connected to the transistor TR. The pixel-electrode may also defines one plate of a storage capacitor CST. A storage common voltage Vst is applied to an opposed plate or electrode of the charge storage capacitor CST.

The first peripheral area PA1 is adjacent to a first end (upper end in FIG. 1) of each of the data lines DL. The first peripheral area PA1 has a plurality of data pad portions 111, 113 and 115 formed therein, including a pad receiving a data signal and a plurality of fan-out portions 112, 114 and 116 connecting to the more spaced apart data lines DL of display area DA and thus linking the DLs to respective ones of the data pad portions 111, 113 and 115.

The second peripheral area PA2 is disposed on the lower substrate in opposition to the first peripheral area PA1. In other words, it is the lower peripheral area in FIG. 1.

The third peripheral area PA3 is adjacent to corresponding first ends of the gate lines GL (left ends in FIG. 1). A first gate driving circuit 131 electrically connects to the first ends of all or a subset of the gate lines GL to generate gate signals applied to the gate lines GL. The first gate driving circuit 131 may alternatively be disposed in the third peripheral area PA3. Yet alternatively, a plurality of gate line pads on which a gate diving chip is disposed may be provided in the third peripheral area PA3 to receive generated gate signals of the first driver chip 131 and/or of optional second driver chip 133.

The fourth peripheral area PA4 is disposed opposite the third peripheral area PA3. The optional second gate driving circuit 133 may be disposed in the fourth peripheral area PA4 and may electrically connect to second ends of all or a subset of the gate lines GL and may generate gate signals that are applied to the corresponding gate lines GL. Alternatively, a gate pad on which the second gate diving chip is formed may be disposed in the fourth peripheral area PA4.

A plurality of to-the-sealant shorting pad structures 151, 152, 153, 154 and 155 are disposed in one or more of the first, second, third and fourth peripheral areas PA1, PA2, PA3 and PA4. More specifically, the shorting pad structures 151, 152, 153, 154 and 155 may be disposed in areas of the first, second, third, and fourth peripheral areas PA1, PA2, PA3, PA4 overlapping with the counter substrate 200 and with the sealant 400. The shorting pad structures 151, 152, 153, 154 and 155 are electrically connected to the counter substrate 200 by way of the sealant 400. For example, the shorting pad structures 151, 152, 153, 154 and 155 may be disposed in just the first peripheral area PA1 and the second peripheral area PA2 as shown in FIG. 1.

The counter substrate 200 faces the display substrate 100. The display substrate 100 and the counter substrate 200 are combined with each other using the conductive sealant 400, and a liquid crystal material layer (not shown) is disposed between the display substrate 100 and the counter substrate 200 and is sealed into that space with use of the conductive sealant 400.

The conductive sealant 400 is disposed on a seal line hypothetically drawn through the first, second, third, and fourth peripheral areas PA1, PA2, PA3 and PA4, to combine the display substrate 100 with the counter substrate 200.

The conductive sealant 400 includes conductive balls (CBs) and is disposed to cover the shorting pad structures 151, 152, 153, 154 and 155 disposed in the first, second, third and fourth peripheral areas PA1, PA2, PA3 and PA4. The shorting pad structures 151, 152, 153, 154 and 155 are electrically connected to the common electrode of the counter substrate 200 through conductive balls CBs (see FIG. 3). The common electrode of the counter substrate 200 is an electrode of the liquid crystal capacitor CLC, and receives the common voltage Vcom that is applied to the shorting pad structures 151, 152, 153, 154 and 155 through the conductive balls CBs.

Figure 2:
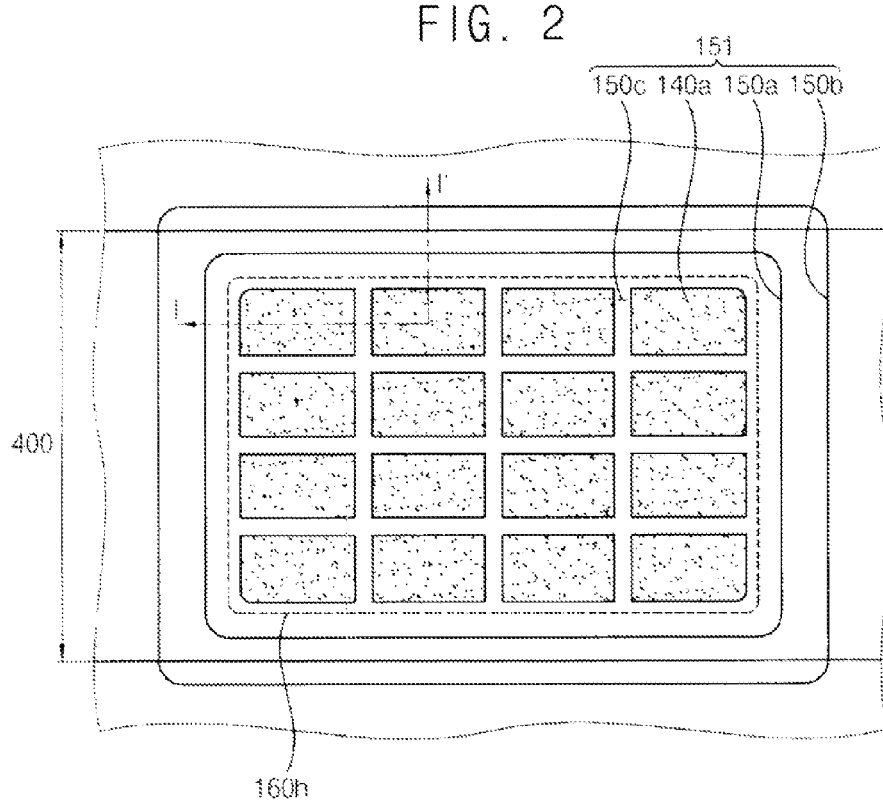
FIG. 2 is an enlarged plan view of a shorting pad structure of FIG. 1.
Figure 3:
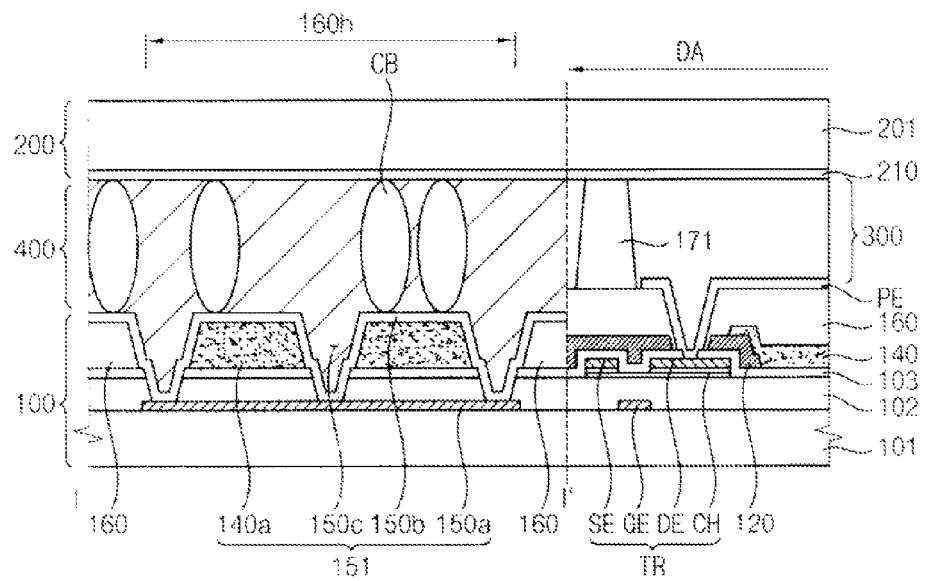
FIG. 3 is a cross-sectional view of a display apparatus of FIG. 1.

FIG. 2 is an enlarged plan view showing a few of the shorting pad structures of FIG. 1 as found under the sealant 400. FIG. 3 is a cross-sectional view of a display apparatus of FIG. 1.

Referring to FIGS. 1, 2 and 3, and as mentioned above, the display apparatus 500 includes a display substrate 100, a counter substrate 200 and a conductive sealant 400.

The display substrate 100 as shown in FIG. 3 includes a transparent first base substrate 101, a thin film transistor TR, a gate insulating layer 102, a transistor protecting layer 103, a light blocking part 120, a color filter 140, an organic layer 160, a pixel electrode PE, a column spacer 171 and a shorting pad structure 151.

The transistor TR includes a gate electrode GE electrically connected to the nearby gate line GL, a semiconductive channel section CH disposed on the gate electrode GE, a source electrode SE disposed on the channel section CH and connected to the nearby data line DA, and a drain electrode DE disposed on the channel section CH and spaced apart from the source electrode SE and electrically connected to the pixel electrode PE.

The gate insulating layer 102 is disposed between the gate electrode GE and the channel pattern CH. The protect layer 103 is disposed on the first base substrate 101 to cover the source electrode SE and the drain electrode DE.

The blocking part 120 is disposed in an area where the transistor TR is disposed on the protecting layer 103 to block light. In addition, the blocking part 120 may disposed in an area corresponding to an area where the gate lines and the data lines are disposed so as to block light leakage from those areas as well.

The color filter 140 is disposed in a pixel area defined on the first base substrate 101 to generate colored light (e.g., Red, Green or Blue).

The organic layer 160 is disposed on the first base substrate 101 on which the color filter 140 is disposed. The organic layer 160 is disposed on the blocking part 120 and the color filter 140 to planarize the display substrate 100 and also seal in the coloring agents of the color filter 140.

The pixel electrode PE is disposed on the organic layer 160 in the pixel area and electrically connected to the transistor TR.

The column spacer 171 maintains a distance between the display substrate 100 and the counter substrate 200. The column spacer 171 includes a transparent organic material.

The shorting pad structure 151 includes a first pad electrode 150a, a spacing compensation pattern 140a, a contact hole 150c and a second pad electrode 150b.

The first pad electrode 150a includes a metal layer formed substantially from the same metal layer as that of the gate lines GL or gate electrodes GE. Alternatively, the first pad electrode 150a may include a metal layer substantially the same as that of the data lines DL or source electrodes SE. In the present example embodiment, the first pad electrode 150a including the metal layer substantially the same as that of the gate line GL is explained.

The plurality of compensation patterns 140a disposed on the first pad electrode 150a are spaced apart from each other such that each may be in an island shape (see FIG. 2). The compensation pattern 140a includes a color photoresist material substantially the same as that of the color filter 140. For example, the compensation pattern 140a may be disposed in a pad access through hole 160h formed through the organic layer 160 and through the gate insulating layer 102, where the latter is disposed on the first pad electrode 150a.

The contact hole 150c is formed in an area where the compensation patterns 140a are spaced apart so that the first pad electrode 150a may be accessed by way of the contact hole 150c. For example, the contact hole 150c is formed in an area where the compensation pattern 140a is not formed, and the contact hole 150c thus allows the second pad electrode 150b to extend down through hole 150c and to thus connect to the first pad electrode 150a. For example, width of the contact hole 150c may be substantially the same or smaller than the size of one of the conductive balls CBs included the conductive sealant 400.

The second pad electrode 150b includes a conductive material and is disposed on the organic layer 160 and also on the color filter material (140) that is patterned to define the compensation pattern 140a. For example, the second pad electrode 150b includes a transparent conductive material substantially the same as that of the pixel electrode PE. The second pad electrode 150b makes contact with the first pad electrode 150a through the contact hole 150c formed in an area where the compensation patterns 140a are spaced apart.

The counter substrate 200 includes a transparent second base substrate 201 and a transparent common electrode 210. The second base substrate 201 includes a transparent insulating substrate. The common electrode 210 is disposed on the second base substrate 201.

The conductive sealant 400 including the conductive balls CBs is structured to operate as a sealant for the liquid crystal material that is disposed in the space between the first and second substrates. The conductive sealant 400 is disposed on a seal line to combine the display substrate 100 with the counter substrate 200. In addition, the conductive balls CB which are included in the conductive sealant 400 function to electrically connect the second pad electrodes 150b of the shorting pad structures 151 to the common electrode 210.

A slightly variable distance between the second pad electrode 150b of the shorting pad 151 and the overlying common electrode 210 of the counter substrate 200 may be compensated for by the flexibility or resiliency of the material (color filter material) of the compensation pattern 140a so that good contact is assured. Thus, open circuit defects between the conductive ball CB and the shorting pad structure 151, and between the conductive ball CB and the common electrode 210 may be prevented.

FIGS. 4A to 4E are flow sheets for explaining a manufacturing process of a display substrate of FIG. 3.

Figure 4A:
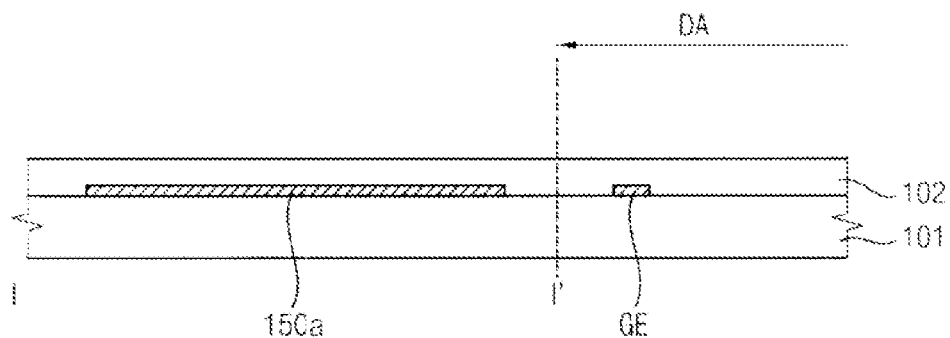
FIGS. 4A to 4E are flow sheets for explaining a manufacturing process for a display substrate of FIG. 3.

Referring to FIGS. 3 and 4A, a first metal layer is formed on the first base substrate 101, and the first metal layer is patterned to form a first metal pattern on the first base substrate 101. The first metal pattern includes the gate lines GL, the gate electrodes GE of the transistors TR and the first pad electrodes 151a of the shorting pads 151, etc. In one embodiment, a length of a side of the first pad electrode 151a is several millimeters in a plan view. Although not shown in the figure, the first pad electrode 151a is electrically connected to a voltage line transmitting the common voltage Vcom and thus the common voltage Vcom is applied to the first pad electrode 151a.

The gate insulating layer 102 is next formed on the first base substrate 101 on which the first metal pattern is formed to cover the first metal pattern. The gate insulating layer 102 may include an inorganic insulating material such as a silicon nitride (SiNx), a silicon oxide (SiOx) or a silicon oxynitride (SiOxNy).

Figure 4B:
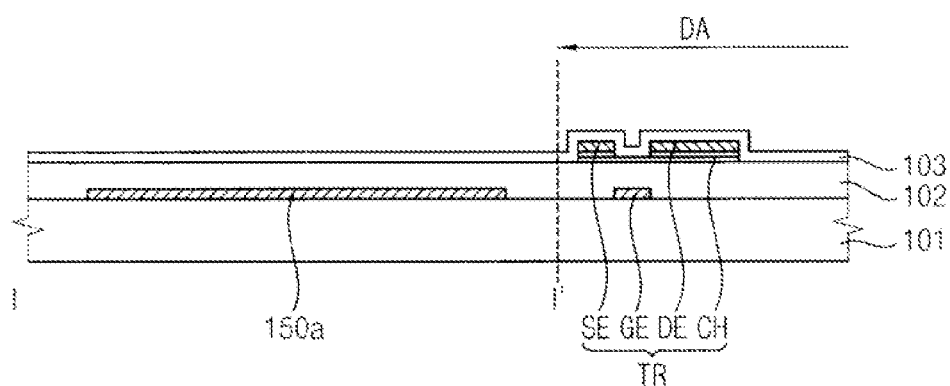

Referring to FIGS. 3 and 4B, a semiconductive channel layer and a second metal layer are sequentially formed on the insulating layer 110. The channel layer and the second metal layer are patterned at the same time to form a second metal pattern, so that the second metal pattern may include a laminated structure having the channel layer and the second metal layer. Alternatively, the channel layer and the second metal layer may be patterned using different masks and photolithography steps from each other.

According to the present example embodiment, the second metal pattern includes the data lines DL, the source electrodes SE and the drain electrodes DE. The portion of the channel pattern CH that is not covered by the source electrode SE and the drain electrode DE is defined as a channel area of the transistor TR.

The protecting layer 103 is formed on the second metal pattern so as to cover the first metal pattern. The protecting layer 103 may include an inorganic insulating material such as a silicon nitride (SiNx) and/or a silicon oxide (SiOx).

Figure 4C:
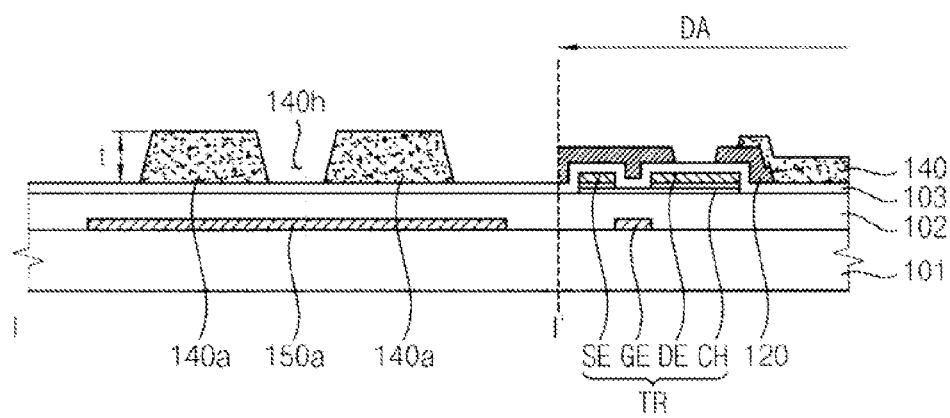

Referring to FIGS. 3 and 4C, a light blocking material layer is formed on the protecting layer 103 is formed, and the blocking material layer is patterned to form a corresponding blocking pattern. The blocking pattern includes the blocking part 120 formed in the display area DA. The blocking part 120 may be formed corresponding to an area where the transistors TR, the gate lines GL and the data lines DL are formed. The blocking part 120 may be formed over a first hole 120c exposing the protecting layer 103 on the drain electrode DE of the transistor TR. The contact hole is formed through the protecting layer 103 corresponding to the first hole 120c to allow the pixel electrode PE to make contact with the drain electrode DE in a following process.

A colored photoresist layer is next formed adjacent to or on the blocking part 120 where the colored photoresist layer is patterned to form a color photo pattern. The color photo pattern includes the color filter patterns 140 formed in the pixel areas and also the patterned material of the compensation pattern 140a which is formed in the area of the contact pad structures 151.

Thicknesses of the color filter 140 and the compensation pattern 140a which are formed using the same color photoresist layer may be different from each other. The compensation pattern 140a is formed to have a relatively large thickness t, so that a top portion of the compensation pattern 140a may be substantially at the same height as a stepped portion of the organic layer 160 formed in a following process. The compensation patterns 140a are spaced apart from each other in an island shape and are formed on an area where the first pad electrode 150a is formed. A separate portion 140h between the compensation patterns 140a exposes the protecting layer 103 for etching therethrough. The height of the stepped portion of the compensation pattern 140a is substantially the same as that of the stepped portion of the organic layer 160 which surrounds the shorting pads 151, so that the stepped portions that occupy most of the area of the shorting pad structure 151 may be substantially coplanar with the surrounding stepped portions of the organic layer 160.

Figure 4D:
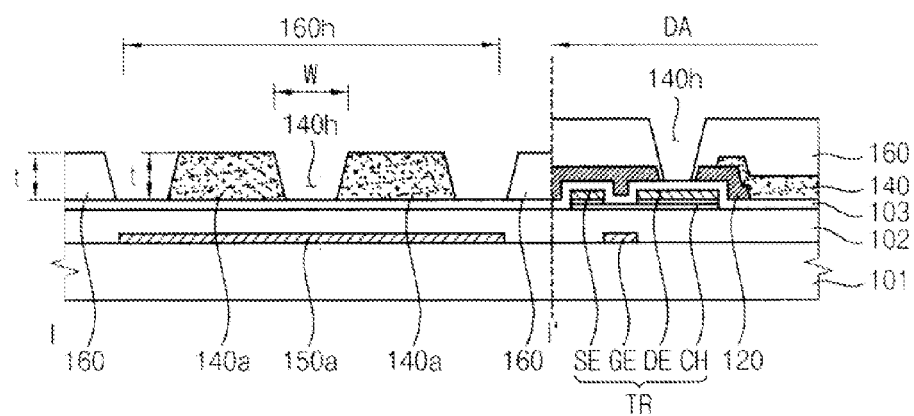

Referring to FIGS. 3 and 4D, an organic material is deposited to form the organic planarizing layer 160. The organic material is deposited over the first base substrate 101 including in areas where the color photo pattern is to be formed. A second hole area 140h is formed through the organic layer 160 over the drain electrode DE and a pad hole area 160h is formed through the organic layer 160 corresponding to an area where the first pad electrode 150a is formed. The patterned color filter material of the compensation pattern 140a is disposed in the pad hole area 160h. As illustrated in the figure, the pad hole 160h may be formed to separate a sidewall of the pad hole 160h from the compensation pattern 140a. Although not shown in the figure, the sidewall of the pad hole 160h may make contact with the sidewall of the compensation pattern 140a. For example, a horizontal width W of the separate portion 140h defined by the compensation pattern 140a is about 10 μm.

Figure 4E:
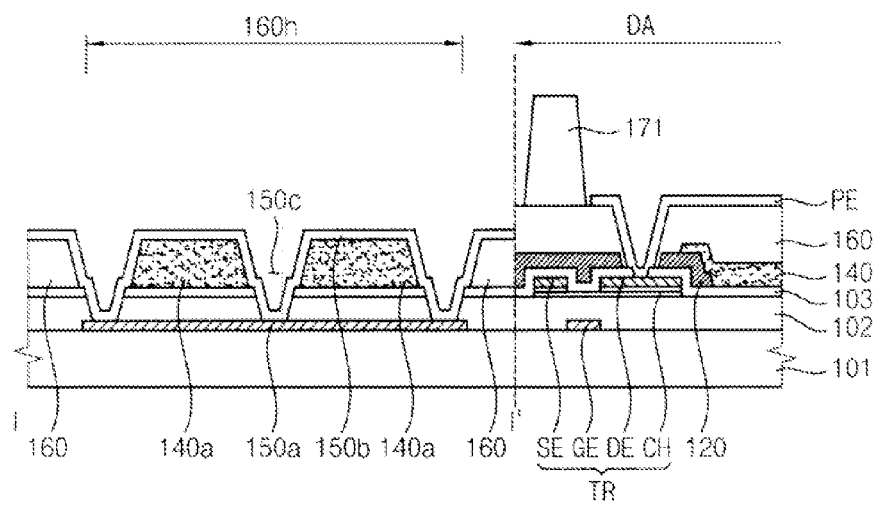

Referring next to FIGS. 3 and 4E, the protecting layer 103 and the gate insulating layer 102 in areas exposed by holes made through the organic layer 160 and through the compensation pattern 140a are etched. For example, the protecting layer 103 corresponding to the second hole 160c is etched to expose the drain electrode DE, and the protecting layer 103 and the gate insulating layer 102 corresponding to the separate portion 140h are etched to expose the first pad electrode 150a.

A transparent conductive layer (e.g., ITO, IZO, etc.) is formed on the first base substrate 101 through which the drain electrode DE and the first pad electrode 150a are exposed, and a transparent conductive pattern is formed. When patterned, the transparent conductive pattern forms the pixel electrode PE and the second pad electrode 150b. The second pad electrode 150b makes contact with the first pad electrode 150a through the contact hole 150c. A width of the contact hole 150c is about 10 μm corresponding to a width of the separate portion 140h.

A column spacer layer is next formed on the first base substrate 101 on which the transparent conductive pattern is formed, and the column spacer layer is patterned to form the column spacer 171 in the display area DA. The column space layer may include a transparent material or an opaque material. For example, the column spacer 171 is formed corresponding to an area where the transistor TR is formed.

The organic layer 160 and the compensation pattern 140a provide a flattened and stepped up height portion of the second pad electrode 150b, so that an area except the separate portion 140h is planarized. Therefore, a planarized plan view dimension of the shorting pad 151 is several millimeters and a width of the contact hole 150c is about 10 μm, so that most of the conductive balls CB are distributed on the stepped up and planarized areas of the compensation pattern 140 to thus prevent open circuit defects between the conductive balls CB and the overlying second substrate 200. The second pad electrode 150b of the shorting pad 151 and a common electrode 210 of the counter substrate 200 may be electrically shorted through the conductive sealant 400 including the conductive ball CB.

Hereinafter, the same reference numerals will be used to refer to the same or like parts as those described in the present example embodiment and thus any repetitive explanation concerning the above elements will be omitted or briefly described.

Figure 5:
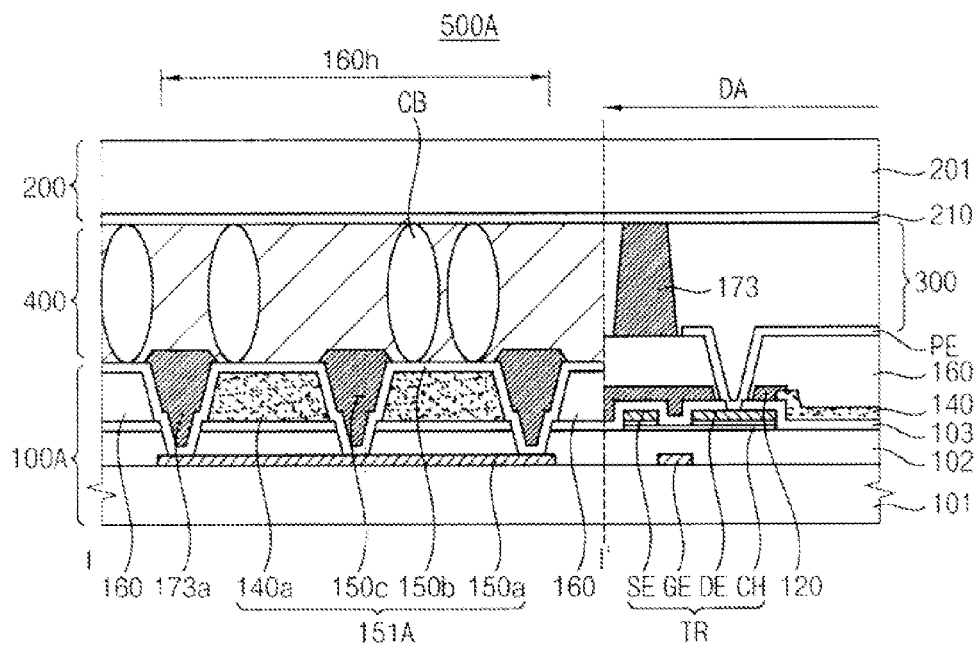
FIG. 5 is a cross-sectional view of a display apparatus according to another example embodiment.

FIG. 5 is a cross-sectional view of a display apparatus according to another example embodiment.

Referring to FIGS. 1 and 5, the display apparatus 500A includes a display substrate 100a, a counter substrate 200 and a conductive sealant 400.

The display substrate 100A includes a first base substrate 101, a transistor TR, a gate insulating layer 102, a protecting layer 103, a blocking part 120, a color filter 140, an organic layer 160, a pixel electrode PE, a column spacer 173 and a shorting pads structure 151A.

Once again, the material of the column spacer 173 helps to maintain a uniform distance between the display substrate 100 and the counter substrate 200. The column spacer 173 may be composed of a transparent insulative material or of an opaque insulative material. For example, the column spacer 173 may be disposed in an area where the transistor TR is disposed thereon.

In the embodiment of FIG. 5, the shorting pad structure 151A includes a first pad electrode 150a, a first compensation pattern 140a, a contact hole 150c, a second pad electrode 150b and a second compensation pattern 173a, where the latter 173a may be composed of a same material as used in the column spacer 173.

The first pad electrode 150a includes a metal layer. The first pad electrode 150a includes a metal layer substantially the same as the gate line GL. Alternatively, the first pad electrode 150a may include a metal layer substantially the same as the data line DL.

The first compensation patterns 140a disposed on the first pad electrode 150a are spaced apart from each other in an island shape. The first compensation pattern 140a includes a color-containing photoresist material substantially the same as one used in the color filter 140. For example, the first compensation pattern 140a may be disposed in a pad hole 160h formed through the organic layer 160 disposed on the first pad electrode 150a.

The contact hole 150c is formed in a separate area of the first compensation pattern 140a. For example, the contact hole 150c is formed in an area exposed by the first compensation pattern 140a to allow for connection of the first pad electrode 150a to the second pad electrodes 150b.

The second pad electrode 150b includes a conductive material and is disposed on the organic layer 160 and on the compensation patterns 140a. For example, the second pad electrode 150b includes a transparent conductive material substantially the same as the pixel electrode PE. The second pad electrode 150b makes contact with the first pad electrode 150a through the contact hole 150c formed in the separate area of the first compensation pattern 173a.

The second compensation pattern 173a which is composed of same material as that of the column spacer 173 is used to fill in the space of the contact hole 150c and to thus help planarize the shorting pad structure 151. The conductive balls CB are prevented from sagging into the filled in contact holes 150c. Thus, open circuit defects of the conductive ball CB are prevented. The second pad electrode 150b of the shorting pad 151 and a common electrode 210 of the counter substrate 200 may be electrically shorted through the conductive sealant 400 including the conductive balls CB.

As mentioned, the second compensation pattern 173a includes a material substantially the same as that used for the column spacer 173. For example, when the column spacer 173 includes an opaque material, the second compensation pattern 173a may block the light reflected by the first pad electrode 150a. Thus, a glare that might be generated in the peripheral areas of the display apparatus 500A may be prevented by using a light absorbing material for the column spacer 173 and for the compensation patterns 173a.

A method of manufacturing the display substrate 100A according to the present example embodiment is substantially the same as the previous example embodiment of FIGS. 4A to 4E. However, in the FIG. 4E, when the column spacer material is formed on the first base substrate 101 in which the transparent conductive pattern is formed, the deposited column spacer material is patterned to not only form the column spacer 173 but to also form the second compensation pattern 173a. The column spacer 173 is formed in the display area DA, and the second compensation pattern 173a is formed in the contact hole areas 150c to thus fill the contact holes 150c of the shorting pad structure 151A and make the latter more planar.

Figure 6:
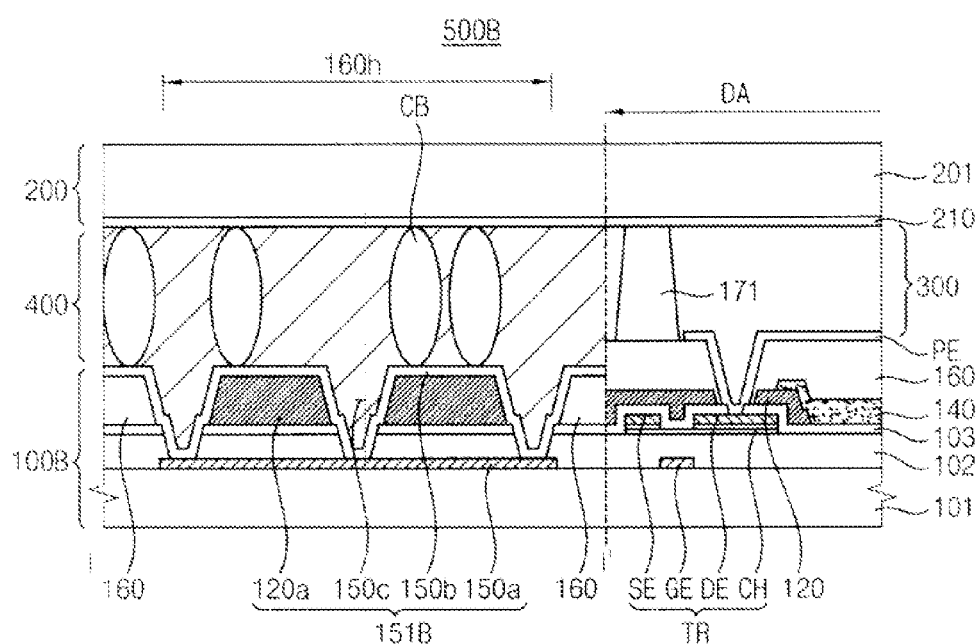
FIG. 6 is a cross-sectional view of a display apparatus according to still another example embodiment.

FIG. 6 is a cross-sectional view of a display apparatus according to still another example embodiment.

Referring to FIGS. 1, 3 and 6, the display apparatus 500B includes a display substrate 100B, a counter substrate 200 and a conductive sealant 400.

The display substrate 100B includes a first base substrate 101, a transistor TR, a gate insulating layer 102, a protecting layer lyer 103, a blocking part 120, a color filter 140, a organic layer 160, a pixel electrode PE, a column spacer 171 and a shorting pads structure 151B.

The shorting pad structure 151B includes a first pad electrode 150a, a compensation pattern 120a, a contact hole 150c and a second pad electrode 150b.

The first pad electrode 150a includes a metal layer. The first pad electrode 150a includes a metal layer substantially the same as the gate line GL. Alternatively, the first pad electrode 150a may include a metal layer substantially the same as the data line DL.

The compensation patterns 120a disposed on the first pad electrode 150a are spaced apart from each other as in an island shape. The compensation pattern 120a includes a material substantially the same as that used for the light blocking part 120. The compensation pattern 120a may be disposed in a pad hole 160h formed through the organic layer 160 formed on the first pad electrode 140a.

The contact hole 150c is formed in a separate area of the compensation patterns 120a. The contact hole 150c is formed in the first pad electrode 150a exposed by the compensation pattern 120a.

The second pad electrode 150b includes a conductive material and is disposed on the organic layer 160 and on the compensation pattern material 120a. For example, the second pad electrode 150b includes a transparent conductive material substantially the same as the pixel electrode PE. The second pad electrode 150b makes contact with the first pad electrode 150a through the contact hole 150c formed in a separate area of the compensation patterns 120a.

Therefore, a plan view dimension of the shorting pad structure 151 can be several millimeters and a width of the contact hole 150c is about 10 μm, so that most of the conductive balls CB are distributed on a substantially planarized top surface area of the compensation pattern 120a to thus prevent open circuit defects of the conductive ball CB. The second pad electrode 150b of the shorting pad structure 151B and a common electrode 210 of the counter substrate 200 may be electrically shorted through the conductive ball CB of the conductive sealant 400.

In addition, as the previous example embodiment referring to FIG. 5, in the embodiment of FIG. 5, a second compensation pattern 173a filling the contact hole 150c with substantially the same material as the column spacer 173 may be formed to remove a stepped portion of the contact hole 150c.

Figure 7A:
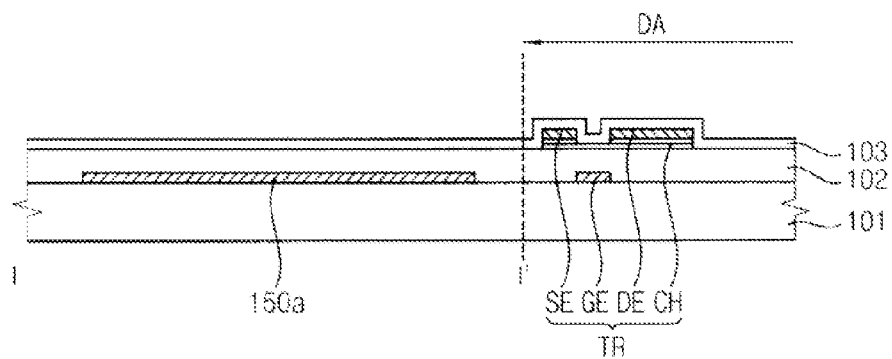
FIGS. 7A to 7C are flow sheets for explaining a manufacturing process for a display substrate of FIG. 6.
Figure 7B:
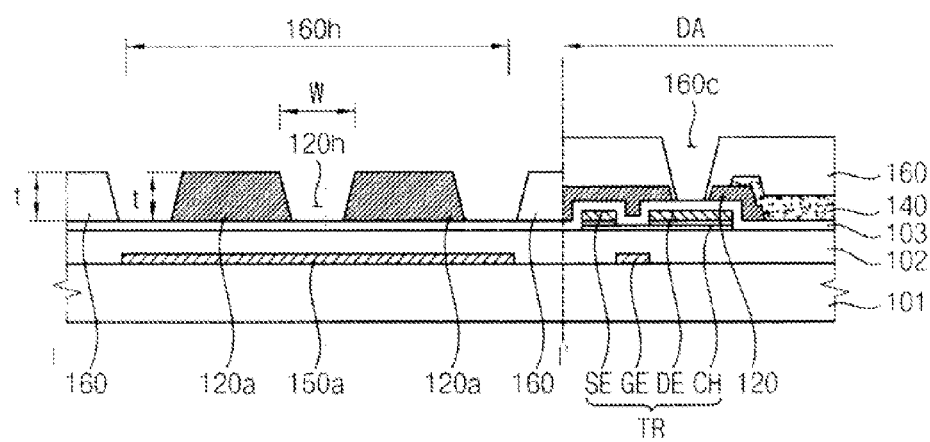
Figure 7C:
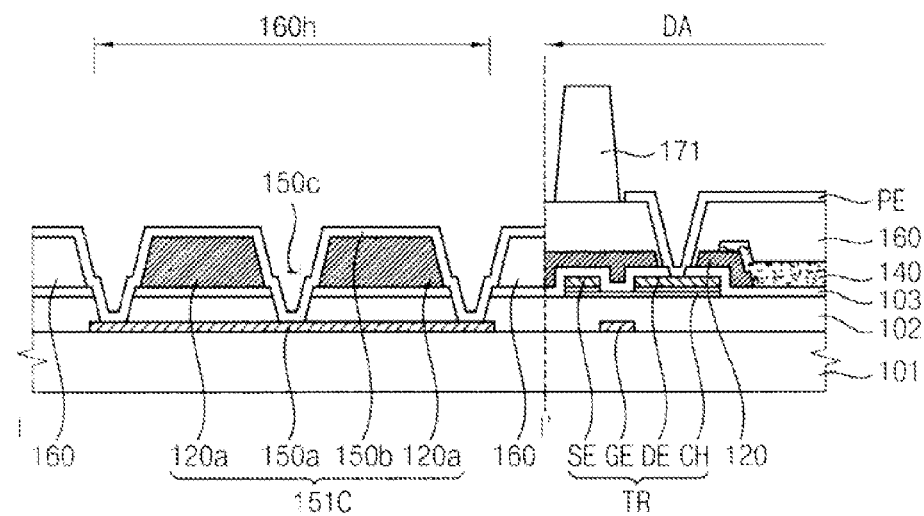

FIGS. 7A to 7C are flow sheets for explaining a manufacturing process for a display substrate of FIG. 6.

Referring to FIGS. 3, 6 and 7A-7C, a method for making the structure of FIG. 6 is disclosed. In FIG. 7A, a first metal pattern, a gate insulating layer 102, a second metal pattern and a protecting layer 103 are formed on the first base substrate 101. The first metal pattern includes a gate line GL, a gate electrode GE of the transistor TR and a first pad electrode 151a of the shorting pad structure 151(B). The gate insulating layer 102 is formed on the first base substrate 101 on which the first metal pattern is formed to cover the first metal pattern. The gate insulating layer 102 may include an inorganic insulating material such as a silicon nitride (SiNx) or a silicon oxide (SiOx).

The second metal pattern is formed by patterning a channel layer and a second metal layer at the same time. The second metal pattern includes a data line DL, a source electrode SE of the transistor TR and a drain electrode DE of the transistor TR. A channel pattern CH not covered by the source electrode SE and the drain electrode DE is defined as a channel area of the transistor TR. The protecting layer 103 is formed on the first base substrate 101 on which the second metal pattern is formed to cover the second metal pattern. The protecting layer 103 may include an inorganic insulating material such as a silicon nitride (SiNx) and/or a silicon oxide (SiOx).

Referring to FIGS. 3, 6 and 7B, a color photoresist layer is formed on the first base substrate 101 on which the protecting layer 103 is formed, and the color photoresist layer is patterned to form a color photo pattern. The color photo pattern includes the color filter 140 formed in the pixel area.

A light blocking material layer is formed on the first base substrate 101 on which the color filter 140 is formed, and the blocking material layer is patterned to form a desired light blocking pattern. The blocking pattern includes the blocking part 120 formed in the display area DA and the compensation pattern 120a formed on the first pad electrode 151a.

The blocking part 120 may be formed corresponding to an area where the transistor TR, the gate line GL and the data line DL are formed. The blocking part 120 may be formed on a first hole 120c exposing the protecting layer 103 on the drain electrode DE of the transistor TR. The first hole 120c may be used as the contact hole for making the pixel electrode PE contact with the drain electrode DE in the following process.

The compensation pattern 120a is formed to have a thickness t, so that a stepped portion of the compensation pattern 120a may be of substantially same height as a stepped portion of the organic layer 160 formed in the following process. The compensations 120a are spaced apart from each other in an island shape and are formed on an area where the first pad electrode 150a is formed. A separate portion 140h between the compensation patterns 120a exposes the protecting layer 103. The stepped portion of the compensation pattern 120a is substantially of the same height as the stepped portion the organic layer 160, to thus substantially planarize most of the area of the shorting pad structure 151(B).

An organic layer 160 is formed on the first base substrate 101 on which the blocking pattern is formed. A second hole 160c is formed through the organic layer 160 over the drain electrode DE and a pad hole 160h is formed through the organic layer 160 corresponding to an area where the first pad electrode 150a is formed. The compensation pattern 120a is disposed in the pad hole area 160h. As illustrated in the figure, the pad hole area 160h may be formed to separate a side wall of the organic layer 160 defining the pad hole 160h from the compensation pattern 120a. Although not shown in the figure, the sidewall of the organic layer 160 defining the pad hole 160h makes contact with the sidewall of the compensation pattern 120a. For example, a width W of the separate portion 140h defined by the compensation pattern 140a is about 10 μm.

Referring to FIGS. 3, 6, and 7C, the protecting layer 103 and the gate insulating layer 102 are etched by etching the first base substrate 101 on which the organic layer 160 including the second hole 160c and the pad hole 160h is formed.

The protecting layer 103 corresponding to the second hole 160c is etched to expose the drain electrode, and the protecting layer 103 and the gate insulating layer 102 corresponding to an area where the compensation pattern 120a is not to be formed are etched to expose the first pad electrode 150a.

A transparent conductive layer is formed on the first base substrate 101 in which the drain electrode DE and the first pad electrode 150a are exposed, and the transparent conductive pattern is formed. The transparent conductive pattern includes the pixel electrode PE and the second pad electrode 150b. The second pad electrode 150b makes contact with the second pad electrode 150b through the formed contact hole 150c.

A column space layer is formed on the first base substrate 101 on which the transparent conductive pattern is formed, and the column spacer layer is patterned to form the column spacer 171 in the display area DA. The column space layer may include a transparent material or an opaque material. For example, the column spacer 171 is formed corresponding to an area where the transistor TR is formed.

The organic layer 160 and the compensation pattern 120a the shorting pad area, except for the contact holes 150c, to be substantially planarized. Therefore, a plan view dimension (e.g., top vie edge side) of the shorting pad structure 151 may be several millimeters and a width of the contact hole 150c is about 10 μm, so that the most of the conductive balls CB are distributed on a planarized area of the compensation pattern 120a to prevent open circuit defects of the conductive ball CB. The second pad electrode 150b of the shorting pad 151 and a common electrode 210 of the counter substrate 200 may be electrically shorted through the conductive sealant 400 including the conductive ball CB.

Figure 8:
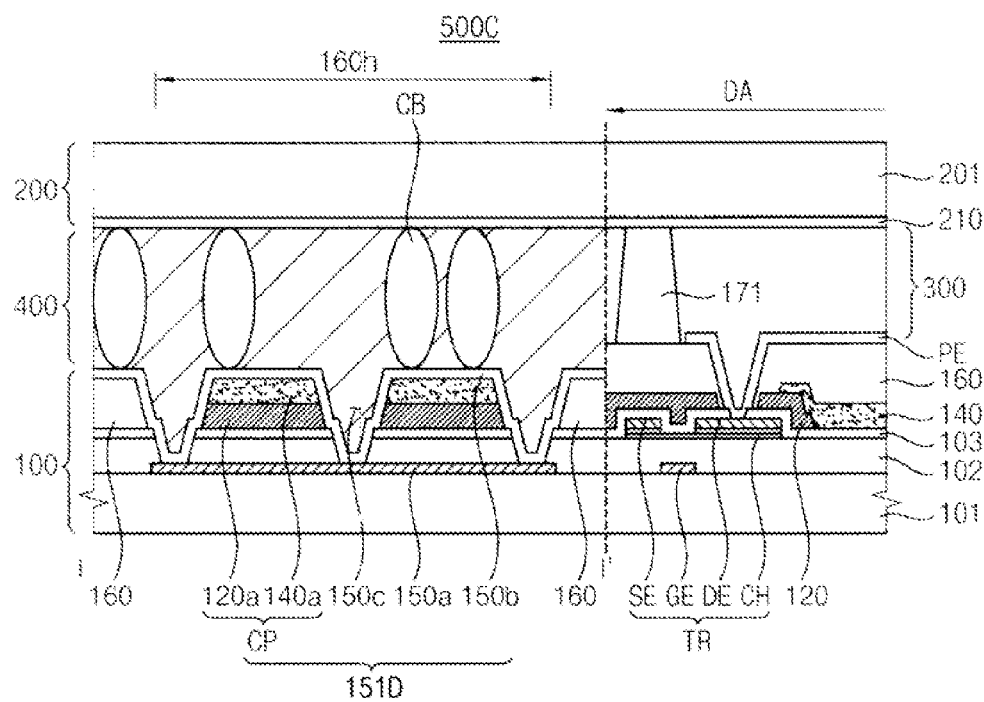
FIG. 8 is a cross-sectional view of a display apparatus according to still another example embodiment.

FIG. 8 is a cross-sectional view of a display apparatus according to still another example embodiment.

Referring to FIGS. 1, 3 and 8, the display apparatus 500C includes a display substrate 100C, a counter substrate 200 and a conductive sealant 400. Here, as can be seen the height compensation steps include layers 120a and 140a.

The display substrate 100C includes a first base substrate 101, a transistor TR, a gate insulating layer 102, a protecting layer lyer 103, a blocking part 120, a color filter 140, a organic layer 160, a pixel electrode PE, a column spacer 171 and a shorting pad structure 151D.

The shorting pad 151C includes a first pad electrode 150a, a compensation pattern CP, a contact hole 150c and a second pad electrode 150b.

The first pad electrode 150a includes a metal layer. The first pad electrode 150a includes a metal layer substantially the same as the gate line GL. Alternatively, the first pad electrode 150a includes a metal layer substantially the same as the data line DL.

The compensations patterns CP disposed on the first pad electrode 150a are spaced apart in an island shape. The compensation pattern CP includes a color layer 140a having substantially the same material as the color filter 140 and a blocking layer 120a having substantially the same material as the light blocking part 120. A laminated structure is thus formed having the materials of both the light blocking layer 120a and the color layer 140a, where the stacking order may be changed according to a manufacturing process. The compensation stack pattern CP (120a/140a) may be disposed in a pad hole 160h formed through the organic layer 160 which is disposed on the first pad electrode 150a.

The compensation stack pattern CP has a thickness compensating, stepped up portion rising to about the height of the surrounding organic layer 160 as provided in the pad hole area 160h. For example, a thickness of the compensation pattern CP in the pad hole area 160h is substantially the same as thickness of the organic layer 160 around the pad hole area 160h.

The contact hole 150c is formed in an area where the adjacent compensation patterns CP are spaced apart. For example, the contact hole 150c is formed in an area where the compensation pattern CP is not formed in the first pad electrode 150a.

The second pad electrode 150b includes a conductive material and is disposed on the organic layer 160 as well as on the CP steps (120a/140a). For example, the second pad electrode 150b includes a transparent conductive material substantially the same as the pixel electrode PE. The second pad electrode 150b makes contact with the first pad electrode 150a through the contact hole 150c formed in an area where the compensation pattern CP is not disposed.

Therefore, a plan view dimension of the shorting pad structure 151D is several millimeters and a width of the contact hole 150c is about 10 μm, so that the most of the conductive balls CB are distributed on a planarized area of the compensation pattern CP to prevent open circuit defects of the conductive ball CB. The second pad electrode 150b of the shorting pad 151 and a common electrode 210 of the counter substrate 200 are electrically shorted through the conductive ball CB of the conductive sealant 400.

In addition, as in the previous example embodiment referring to FIG. 5, for the embodiment of FIG. 8, a second compensation pattern 173a may be used for filling in the contact hole 150c with substantially the same material as the opaque column spacer 173 and this may further planarize the area of the contact hole 150c.

Figure 9A:
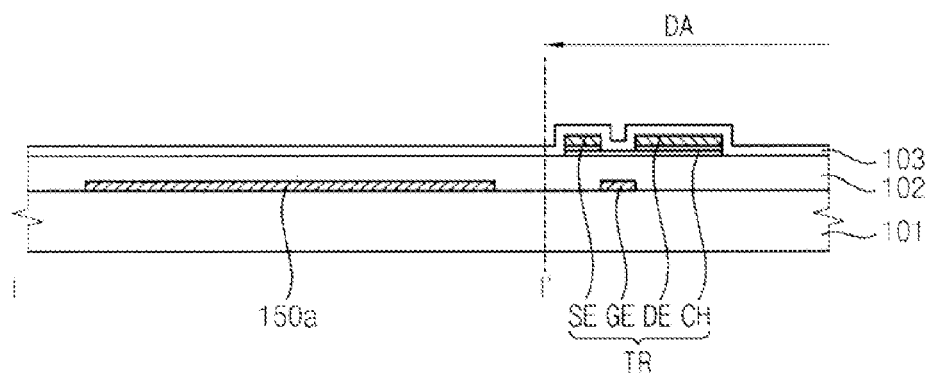
FIGS. 9A to 9C are flow sheets for explaining a manufacturing process for a display substrate of FIG. 8.
Figure 9B:
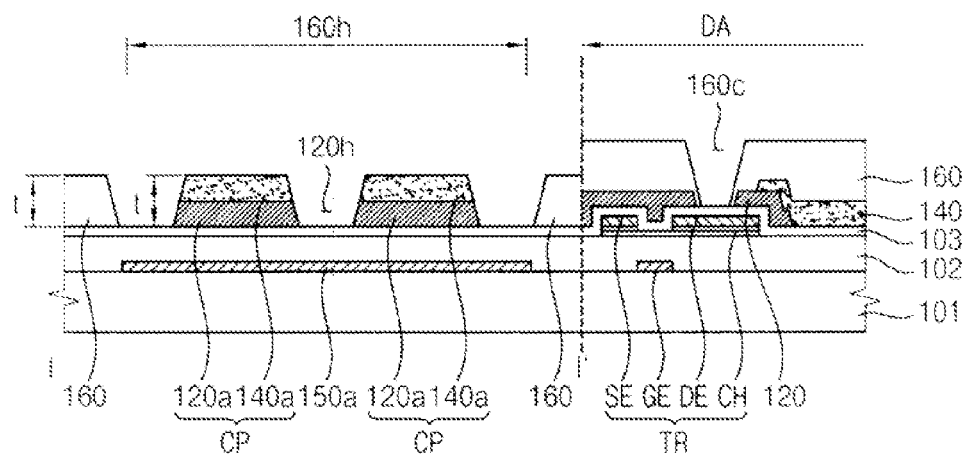
Figure 9C:
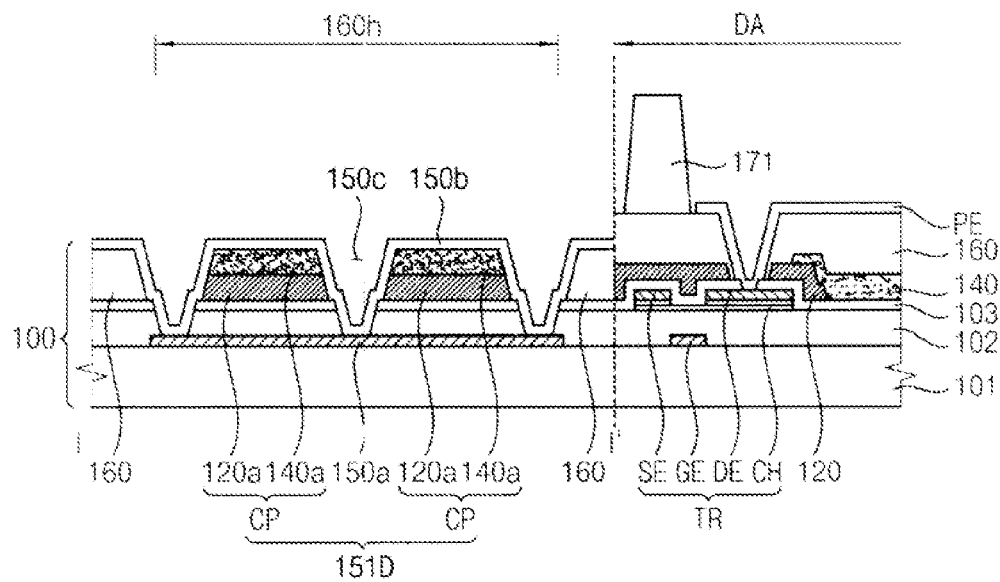

FIGS. 9A to 9C are flow sheets for explaining a manufacturing process for a display substrate of FIG. 8.

Referring to FIGS. 3, 8 and 9A, a first metal pattern, a gate insulating layer 102, a second metal pattern and a protecting layer 103 are formed on the first base substrate 101. The first metal pattern includes a gate line GL, a gate electrode GE of the transistor TR and the first pad electrode 151a of the shorting pad structure 151. The gate insulating layer 102 is formed on the first base substrate 101 on which the first metal pattern is formed to cover the first metal pattern. The gate insulating layer 102 may include an inorganic insulating material such as a silicon nitride (SiNx) and a silicon oxide (SiOx).

The second metal pattern is formed by patterning a channel layer and a second metal layer at the same time. Alternatively, the channel layer and the second metal layer may be patterned using different masks from each other. The second metal pattern includes the data line DL, the source electrode SE of the transistor TR and the drain electrode DE of the transistor TR. A channel pattern CH not covered by the source electrode SE and the drain electrode DE is defined as a channel area of the transistor TR. The protecting layer 103 is formed on the first base substrate 101 on which the second metal pattern is formed to cover the second metal pattern. The protecting layer 103 may include an inorganic insulating material such as a silicon nitride (SiNx) and/or a silicon oxide (SiOx).

Referring to FIGS. 3, 8 and 9B, a light blocking material layer is formed on the first base substrate 101 on which the protecting layer 103 is formed, and the blocking material layer is patterned to form a blocking pattern. The blocking pattern includes the blocking part 120 formed in the display area DA and the blocking layer 120a formed on the first pad electrode 150a.

A color photoresist layer is formed on the first base substrate 101 on which the blocking pattern is formed, and the color photoresist layer is patterned to form a color photo pattern. The color photo pattern includes the color filter 140 formed in the pixel area and the color layer 140a formed on the blocking layer 120a. Accordingly, the compensation stack pattern CP (120a/140a) having the blocking layer 120a and the color layer 140a is formed on the first pad electrode 150a. The compensation pattern CP is formed to have a thickness t, so that a stepped portion of the compensation pattern CP may be substantially at a same height as the surrounding stepped up portions of the organic layer 160 formed in the following process.

The compensation stacks CP are spaced apart from each other by a separate portion 120h in an island shape and are formed on the protecting layer 103 on an area where the first pad electrode 150a is formed. The protecting layer 103 formed in an area where the compensation pattern CP is not formed is exposed. The stepped portion of the compensation pattern CP is substantially the same height as the stepped up portion of the organic layer 160, so as to planarize most of the area of the shorting pad structure 151D.

An organic layer 160 is formed on the first base substrate 101 on which the color photo pattern is formed. A second hole 160c is formed through the organic layer 160 over the drain electrode DE and a pad hole 160h is formed through the organic layer 160 corresponding to an area where the first pad electrode 150a is formed. The compensation pattern CP is disposed in the pad hole 160h. As illustrated in the figure, the pad hole 160h may be formed to separate a sidewall of the organic layer 160 defining the pad hole 160h from the compensation pattern CP. Although not shown in the figure, the sidewall of the organic layer 160 defining the pad hole 160h makes contact with the sidewall of the compensation pattern CP. For example, a width W of the contact hole 150c is about 10 μm.

Referring to FIGS. 3, 8 and 9C, the first base substrate 101 on which the second hole 160c and the organic layer 160 including the pad hole 160h are formed is etched to etch through the protecting layer 103 and the gate insulating layer 102.

The protecting layer 103 corresponding to the second hole 160c is etched to expose the drain electrode DE, and the protecting layer 103 and the gate insulating layer 102 corresponding to an area where the compensation pattern CP is not formed are etched to expose the first pad electrode 150a.

A transparent conductive layer is formed on the first base substrate 101 through which the drain electrode DE and the first pad electrode 150a are exposed, and the transparent conductive pattern is formed. The transparent conductive pattern includes the pixel electrode PE and the second pad electrode 150b. The second pad electrode 150b makes contact with the second pad electrode 150b through the contact hole 150c.

A column space layer is formed on the first base substrate 101 on which the transparent conductive pattern is formed, and the column spacer layer is patterned to form a column spacer 171 in the display area DA. The column space layer may include a transparent material or an opaque material. For example, the column spacer 171 is formed corresponding to an area where the transistor TR is formed.

The organic layer 160 and the compensation stack pattern CP help to planarize the top surface of the second pad electrode 150b, so that an area except the contact hole 150c is planarized. Therefore, a size of the shorting pad 151 is several millimeters and a width W of the contact hole 150c is about 10 μm, so that the most of the conductive balls CB are distributed on a planarized area of the compensation pattern CP to prevent open circuit defects of the conductive ball CB. The second pad electrode 150b of the shorting pad structure 151 and a common electrode 210 of the counter substrate 200 may be electrically shorted through the conductive sealant 400 including the conductive ball CB.

Figure 10:
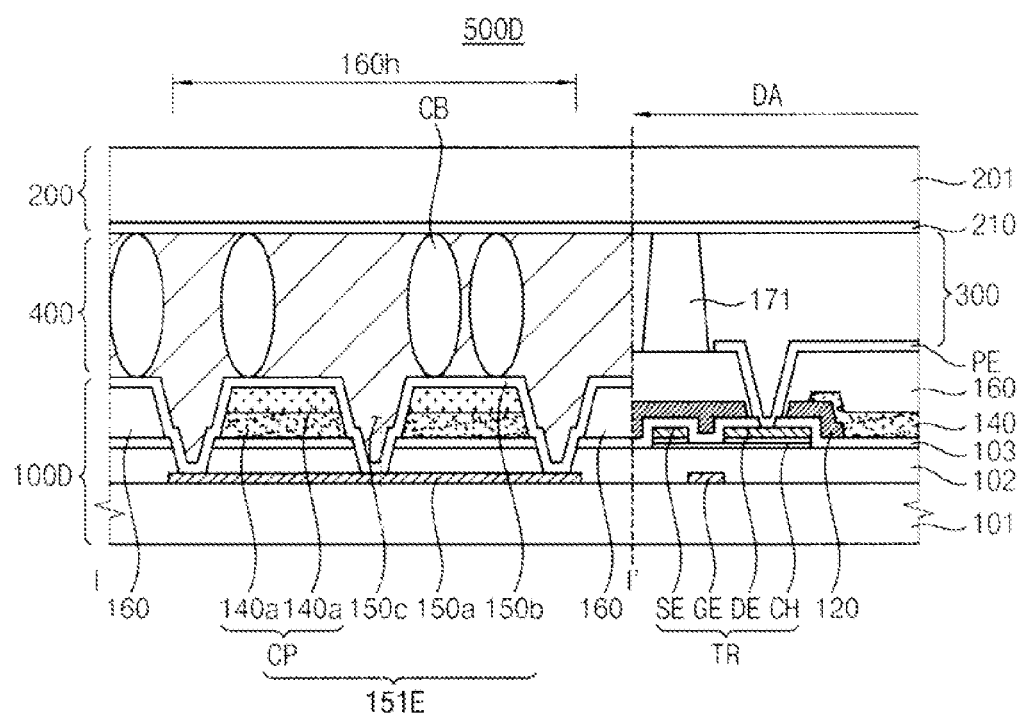
FIG. 10 is a cross-sectional view of a display apparatus according to still another example embodiment.

FIG. 10 is a cross-sectional view of a display apparatus according to still another example embodiment.

Referring to FIGS. 1, 3 and 10, the display apparatus 500D includes a display substrate 100D, a counter substrate 200 and a conductive sealant 400.

The display substrate 100D includes a first base substrate 101, a transistor TR, a gate insulating layer 102, a protecting layer 103, a blocking part 120, a color filter 140, a organic layer 160, a pixel electrode PE, a column spacer 171 and a shorting pad 151E'.

The first pad electrode 150a includes a metal layer. The first pad electrode 150a includes a metal layer substantially the same as the gate line GL. Alternatively, the first pad electrode 150a includes a metal layer substantially the same as the data line DL.

The compensation patterns CP disposed on the first pad electrode 150a are spaced apart from each other in an island shape. The compensation pattern CP includes a first color layer 140a having a color photoresist substantially the same as the color filter 140 and a second color layer 140b having a color photoresist different from the color filter 140. A laminated structure having the first color layer 140a and the second color layer 140b may be changed in order in accordance with a manufacturing process. The compensation stack pattern CP (140a.140b) may be disposed in a pad hole area 160h formed through the organic layer 160 disposed on the first pad electrode 150a.

The contact hole 150c is formed in an area where the adjacent compensation patterns CP are spaced apart. For example, the contact hole 150c is formed in an area where the compensation pattern CP is not formed in the first pad electrode 150a.

The second pad electrode 150b includes a conductive material and is disposed on the organic layer 160. For example, the second pad electrode 150b includes a transparent conductive material substantially the same as the pixel electrode PE. The second pad electrode 150b makes contact with the first pad electrode 150a through the contact hole 150c formed in an area where the compensation pattern CP is not disposed.

Therefore, a size of the shorting pad 151 is several millimeters and a width of the contact hole 150c is about 10 μm, so that the most of the conductive balls CB are distributed on a planarized area of the compensation pattern CP to prevent open circuit defects of the conductive ball CB. The second pad electrode 150b of the shorting pad structure 151 and a common electrode 210 of the counter substrate 200 are electrically shorted through the conductive ball CB of the conductive sealant 400.

In addition, as in the previous example embodiment referring to FIG. 5, the embodiment of FIG. 10 may have a second compensation pattern 173a filling the contact hole areas 150c with substantially the same material as the opaque column spacer 173 so as to thereby further planarize the top surface of electrode 150b, particularly around the areas of the contact holes 150c.

Figure 11A:
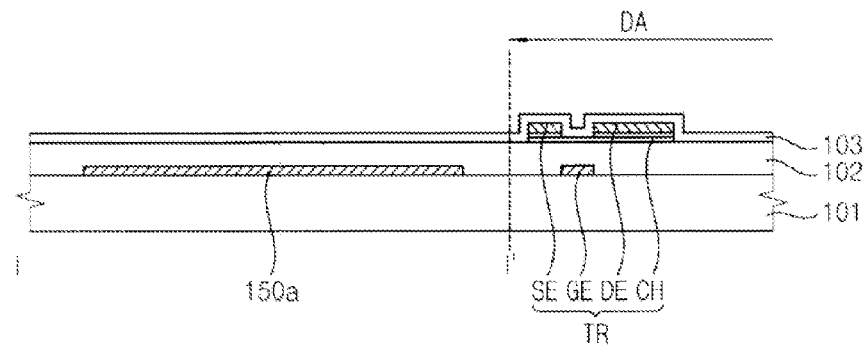
FIGS. 11A to 11C are flow sheets for explaining a manufacturing process for a display substrate of FIG. 10.
Figure 11B:
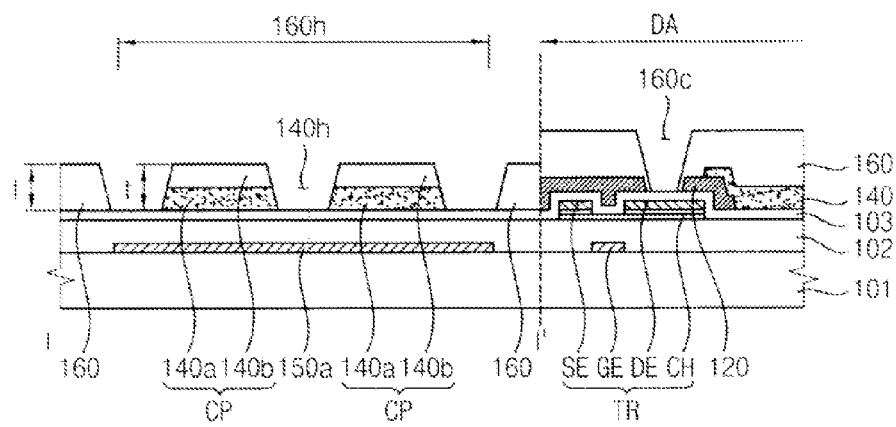
Figure 11C:
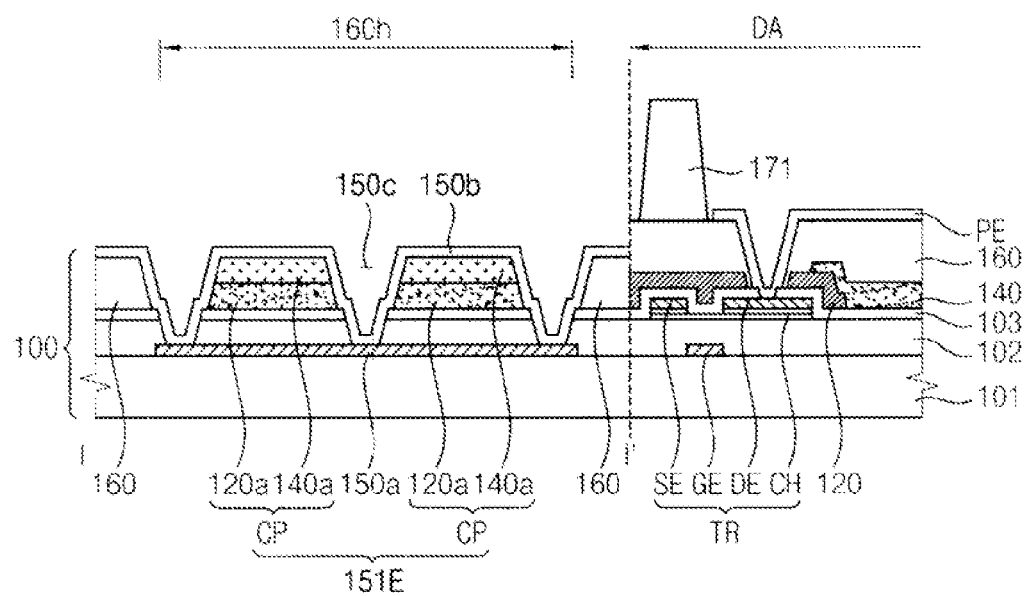

FIGS. 11A to 11C are flow sheets for explaining a manufacturing process for a display substrate of FIG. 10

Referring to FIGS. 3, 10 and 11A, a first metal pattern, a gate insulating layer 102, a second metal pattern and a protecting layer 103 are formed on the first base substrate 101. The first metal pattern includes a gate line GL, a gate electrode GE of the transistor TR and the first pad electrode 151a of the shorting pad structure 151. The gate insulating layer 102 is formed on the first base substrate 101 on which the first metal pattern is formed to cover the first metal pattern. The gate insulating layer 102 may include an inorganic insulating material such as a silicon nitride (SiNx) and a silicon oxide (SiOx).

The second metal pattern is formed by patterning a channel layer and a second metal layer at the same time. Alternatively, the channel layer and the second metal layer may be patterned using different masks from each other. The second metal pattern includes the data line DL, the source electrode SE of the transistor TR and the drain electrode DE of the transistor TR. A channel pattern CH not covered by the source electrode SE and the drain electrode DE is defined as a channel area of the transistor TR. The protecting layer 103 is formed on the first base substrate 101 on which the second metal pattern is formed to cover the second metal pattern. The protecting layer 103 may include an inorganic insulating material such as a silicon nitride (SiNx) and a silicon oxide (SiOx).

Referring to FIGS. 3, 10 and 11B, a light blocking and/or absorbing material layer is formed on the first base substrate 101 on which the protecting layer 103 is formed, and the blocking material layer is patterned to form the blocking pattern. The blocking pattern includes the blocking part 120 formed in the display area DA.

A first color photoresist layer is formed on the first base substrate 101 on which the blocking pattern is formed, and the first color photoresist is patterned to form a first color photo pattern. The first color photo pattern includes the color filter 140 formed in the pixel area and the first color layer 140a formed on the first pad electrode. Then, a different second color photoresist layer is formed on the first base substrate 101 on which the first color photo pattern is formed, and the second color photoresist is patterned to form a second color photo pattern. The second color photo pattern includes a color filter (not shown in the figure) formed in an pixel area adjacent to the color filter 140 and the second color layer 140b formed on the first color layer 140a. Accordingly, the compensation stack pattern CP (140a/140b) having the first color layer 140a and the second color layer 140b is formed on the first pad electrode 150a. The compensation pattern CP is formed to have a thickness t, so that a stepped portion of the compensation pattern CP may be substantially the same as a stepped portion of the organic layer 160 formed in the following process.

The compensation stacks CP (140a/140b) are spaced apart from each other by a separate portion 120h in an island shape and are formed on the protecting layer 103 on an area where the first pad electrode 150a is formed. The protecting layer 103 formed in an area where the compensation pattern CP is not formed is exposed. The stepped portion of the compensation pattern CP is substantially the same height as the stepped portion of the organic layer 160, so as to thereby planarize most of the area of the shorting pad structure 151.

An organic layer 160 is formed on the first base substrate 101 on which the second color photo pattern is formed. A second hole 160c is formed through the organic layer 160 over the drain electrode DE, and a pad hole 160h is formed through the organic layer 160 corresponding to an area where the first pad electrode 150a is formed. The compensation pattern CP is disposed in the pad hole 160h. As illustrated in the figure, the pad hole 160h may be formed to separate a sidewall of the organic layer 160 defining the pad hole 160h from the compensation pattern CP. Although not shown in the figure, the sidewall of the organic layer 160 defining the pad hole 160h makes contact with the sidewall of the compensation pattern CP. For example, a width W of the contact hole 150c is about 10 μm.

Referring to FIGS. 3, 10 and 11C, the first base substrate 101 on which the second hole 160c and the organic layer 160 including the pad hole 160h are formed is etched to etch the protecting layer 103 and the gate insulating layer 102.

The protecting layer 103 corresponding to the second hole 160c is etched to expose the drain electrode DE and the protecting layer 103 and the gate insulating layer 102 corresponding to an area where the compensation pattern CP is not formed are etched to expose the first pad electrode 150a.

A transparent conductive layer is formed on the first base substrate 101 through which the drain electrode DE and the first pad electrode 150a is exposed, and the transparent conductive pattern is formed. The transparent conductive pattern includes the pixel electrode PE and the second pad electrode 150b. The second pad electrode 150b makes contact with the second pad electrode 150b through the contact hole 150c.

A column space layer is formed on the first base substrate 101 on which the transparent conductive pattern is formed, and the column spacer layer is patterned to form a column spacer 171 in the display area DA. The column space layer may include a transparent material or an opaque material. For example, the column spacer 171 is formed corresponding to an area where the transistor TR is formed.

The organic layer 160 and the compensation pattern CP remove dropped down portions of the second pad electrode 150b, so that an area except the contact hole 150c is substantially planarized. Therefore, a size of the shorting pad 151 is several millimeters and a width W of the contact hole 150c is about 10 μm, so that the most of the conductive balls CB are distributed on the planarized area of the compensation pattern CP to prevent open circuit defects of the conductive ball CB. The second pad electrode 150b of the shorting pad 151 and a common electrode 210 of the counter substrate 200 may be electrically shorted through the conductive sealant 400 including the conductive ball CB.

Figure 12:
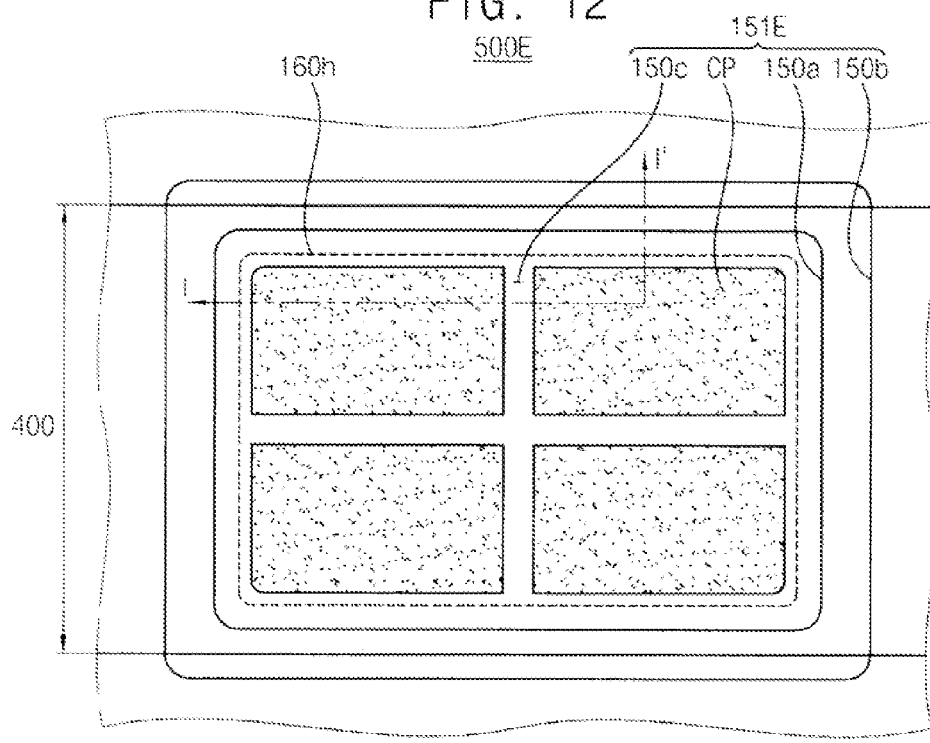
FIG. 12 is an enlarged plan view of a shorting pad structure according to still another example embodiment.

FIG. 12 is an enlarged plan view of a shorting pad structure according to still another example embodiment. A plane structure of a compensation pattern CP according to the present example embodiment is different from that of the compensation pattern CP according to the previous example embodiment in FIGS. 1 to 4E, and a cross-sectional structure of the compensation pattern CP according to the present example embodiment may be substantially the same as that of the compensation pattern CP according to the previous example embodiment in FIGS. 1 to 11C.

Referring to FIGS. 1 and 12, the display apparatus 500E includes a shorting pad structure 151E. The shorting pad structure 151E includes a first pad electrode 150a, a compensation pattern CP, a contact hole 150c and a second pad electrode 150b.

The compensation pattern CP is disposed in a hole area 160h formed through the organic layer 160 which is disposed on the first pad electrode 150a to compensate a stepped portion of the organic layer 160. Four compensation pattern islands CP are disposed by dividing an area where the first pad electrode 150a is formed into four quarter parts. The contact hole 150c is defined in an area where the four compensation patterns CP are spaced apart.

The compensation patterns CP help remove dropped down portions of the surrounding organic layer 160, so that an area except the contact hole 150c may be substantially planarized in the shorting pad structure 151E. Therefore, the most of the conductive balls CB included in the conductive sealant 400 are distributed on the compensation pattern CP to prevent open circuit defects.

The compensation pattern CP according to the present example embodiment may be formed from a color photoresist layer like the compensation pattern CP according to the previous example embodiment in FIGS. 1 to 4E, may include a blocking material layer like the compensation pattern CP according to the previous example embodiment in FIGS. 6 to 7C, may include a color layer formed from a color photoresist layer and a blocking layer having a blocking material layer like the compensation pattern CP according to the previous example embodiment in FIGS. 8 to 9C, or may include a first color layer and a second color layer formed from color photoresist layers different from each other like the compensation pattern CP according to the previous example embodiment in FIGS. 10 to 11C. Alternatively, the present example embodiment may further include a second compensation pattern filling the contact hole 150c with a transparent column spacer layer or an opaque column spacer layer like the compensation pattern CP according to the previous example embodiment in FIG. 5.

Figure 13:
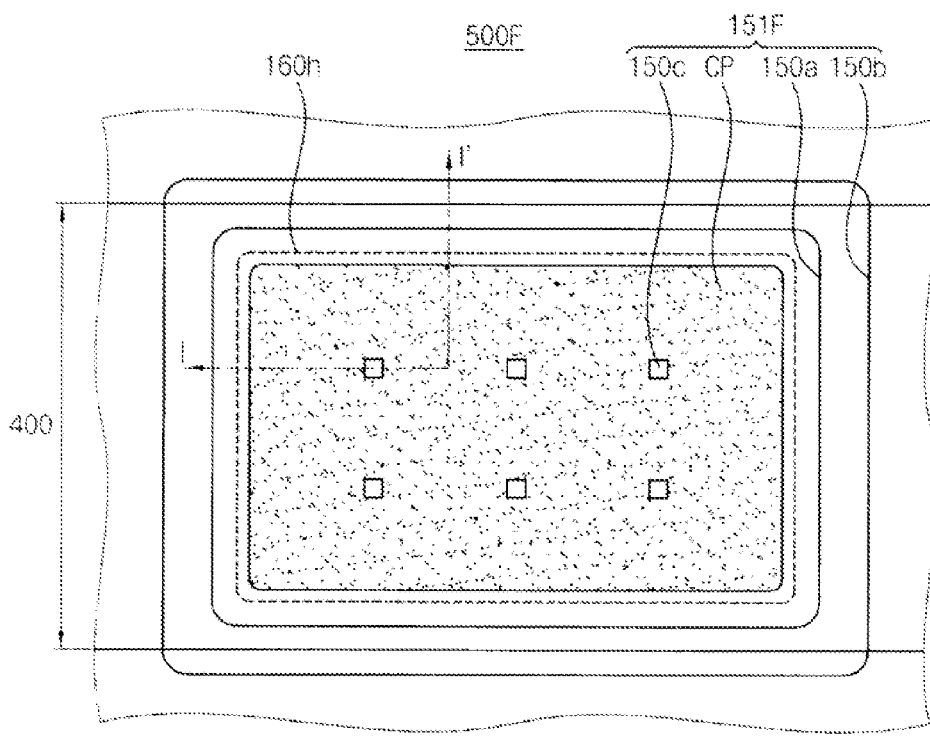
FIG. 13 is an enlarged plan view of a shorting pad structure according to still another example embodiment.

FIG. 13 is an enlarged plan view of a shorting pad according to still another example embodiment. A plane structure of a compensation pattern CP according to the present example embodiment is different from that of the compensation pattern CP according to the previous example embodiment in FIGS. 1 to 4E, and a cross-sectional structure of the compensation pattern CP according to the present example embodiment may be substantially the same as that of the compensation pattern CP according to the previous example embodiment in FIGS. 1 to 11C.

Referring to FIGS. 1 and 13, the display apparatus 500F includes a shorting pad structure 151F. The shorting pad structure 151F includes a first pad electrode 150a, a compensation pattern CP, a contact hole 150c and a second pad electrode 150b.

The compensation pattern CP is disposed in a pad hole 160h formed through the organic layer 160 which is disposed on the first pad electrode 150a to compensate a stepped portion of the organic layer 160.

The contact hole 150c is formed in the compensation pattern CP and the second pad electrode 150b makes contact with the first pad electrode 150a through the contact hole 150c.

In the shorting pad structure 151F, the compensation pattern CP removes a stepped portion of the organic layer 160, so that an area except the contact hole 150c is planarized. Therefore, the most of the conductive balls CB included in the conductive sealant 400 are distributed on the compensation pattern CP to prevent open circuit defects.

The compensation pattern CP according to the present example embodiment may be formed from a color photoresist layer like the compensation pattern CP according to the previous example embodiment in FIGS. 1 to 4E, may include a blocking material layer like the compensation pattern CP according to the previous example embodiment in FIGS. 6 to 7C, may include a color layer formed from a color photoresist layer and a blocking layer having a blocking material layer like the compensation pattern CP according to the previous example embodiment in FIGS. 8 to 9C, or may include a first color layer and a second color layer formed from color photoresist layers different from each other like the compensation pattern CP according to the previous example embodiment in FIGS. 10 to 11C. Alternatively, the present example embodiment may further include a second compensation pattern filling the contact hole 150c with a transparent column spacer layer or an opaque column spacer layer like the compensation pattern CP according to the previous example embodiment in FIG. 5.

According to the example embodiments of the present disclosure, a stepped-up portion of a shorting pad structure is formed on a display substrate to help electrically connect the display substrate of the display apparatus to the counter substrate of the display apparatus and to prevent open circuit defects of a conductive ball included in a conductive sealant.

The foregoing is illustrative of the present teachings and is not to be construed as limiting thereof. Although a few example embodiments have been described, those skilled in the pertinent art will readily appreciate from the foregoing that many modifications are possible in the example embodiments without materially departing from the novel teachings and advantages of the present disclosure. Accordingly, all such modifications are intended to be included within the scope of the present teachings. In the claims, means-plus-function clauses are intended to cover the structures described herein as performing the recited function and not only structural equivalents but also functionally equivalent structures.

What is claimed is:

1. A first display substrate for use with a spaced apart and overlying second substrate where one or more electrical contact connections are to be made between the first and second substrates, said first substrate having layer sections disposed at different heights relative to a bottom section of the first substrate and said first substrate further comprising:
    a color filter;
    a plurality of pixel electrodes disposed in a display area of the first substrate, each pixel electrode having a field producing portion and having a connecting portion where the connecting portion is electrically connected to a corresponding one of plural transistors disposed on the first substrate, each of the transistors being connected to a corresponding one of plural gate lines disposed on the first substrate and to a corresponding one of plural data lines disposed on the first substrate;
    an electrically insulative organic layer disposed on the first substrate, the organic layer including sections interposed between respective ones of the transistors and the field producing portions of their corresponding pixel electrodes; and
    a shorting pad structure disposed in a non-image displaying, peripheral area of the first substrate, the shorting pad surface comprising:
        a first pad electrode disposed at a first height section of the first substrate;
        a first height compensation structure disposed on the first pad electrode, the first substrate and first height compensation structure being disposed within a pad hole area of the first substrate, where the pad hole area is defined by a respective pad hole extending through a non-image displaying, peripheral area portion of the electrically insulative organic layer; and
        a second pad electrode disposed at a second height section of the first substrate, the second height section being above the first height section, where the first height compensation structure is interposed between the first and second pad electrodes and where the second pad electrode is electrically connected to the first pad electrode by way of a contact hole defined through a contact hole exposing area of the first height compensation structure.

2. The first display substrate of claim 1, further comprising:
    a column spacer formed of a spacer material and disposed in the display area of the first substrate; and
    a second height compensation structure disposed in the contact hole exposing area of the first height compensation structure so as to fill the contact hole exposing area, the second height compensation structure being made with substantially the same spacer material as that of the column spacer.

3. The first display substrate of claim 1, wherein the color filter includes respective materials disposed to define respective color filters under corresponding ones of the pixel electrodes, wherein the first height compensation structure includes at least a first height defining layer defining a height of the first height compensation structure and being composed of substantially the same material as at least one of the color filter materials.

4. The first display substrate of claim 1, further comprising a plurality of different color filter materials disposed to define respective color filters under corresponding ones of the pixel electrodes, wherein the first height compensation structure includes at least a first height defining layer and a second height defining layer which in combination define a height of the first height compensation structure, where the first height defining layer is composed of substantially a same first color filter material among said plurality of different color filter materials and where the second height defining layer is composed of substantially a same second color filter material among said plurality of different color filter materials.

5. The first display substrate of claim 1, further comprising a light blocking material disposed in areas of the first substrate where the gate lines and the data lines are disposed, wherein the first height compensation structure includes a material substantially the same as the light blocking material.

6. The first display substrate of claim 1, wherein:
the color filter comprises a plurality of different color filter materials disposed to define respective color filters under corresponding ones of the pixel electrodes; and
the first display substrate comprises a light blocking material disposed in areas of the first substrate where the gate lines and the data lines are disposed,
wherein the first height compensation structure includes at least a first height defining layer and a second height defining layer which in combination define a height of the first height compensation structure, where the first height defining layer is composed of substantially a same material as one of the one or more color filter materials and where the second height defining layer is composed of substantially a same material as the light blocking material.

7. A method of manufacturing a display substrate, the method comprising:
forming a transistor in a display area of a base substrate and a first pad electrode in a peripheral area surrounding the display area;
forming a color filter material layer on the base substrate after the transistor is formed;
forming a first height compensation structure on the first pad electrode, the first height compensation structure including part of the color filter material layer;
forming an organic layer on the base substrate on which the color filter material layer is formed, the organic layer having a pad hole formed through the organic layer and corresponding to the first pad electrode; and
forming a pixel electrode and a second pad electrode of the first height compensation structure, the pixel electrode being formed on the organic layer and being connected to the transistor, the second pad electrode being formed above a height providing intermediate sub-structure of the first height compensation structure and the second pad electrode being connected to the first pad electrode through a contact hole, the contact hole being defined through the organic layer in an area exposed by the first height compensation structure.

8. The method of claim 7, further comprising:
forming a second height compensation structure to fill a space above the contact hole of the second pad electrode, the second height compensation structure including a column spacer material.

9. The method of claim 8, wherein the column spacer material includes an opaque material.

10. The method of claim 7, further comprising
forming a color filter between the base substrate and the pixel electrode using a color photo material as part of the color filter material layer,
wherein the part of the color filter material layer used in the first height compensation structure includes the color photo material.

11. The method of claim 7, further comprising using the color filter material layer to form a plurality of color filters between the base substrate and the pixel electrode by using a plurality of different color photo materials wherein the first height compensation structure includes a plurality of height providing layers that include respective ones of the different color photo materials.

12. The method of claim 7, further comprising:
forming the gate line and the data line;
forming a light blocking part at an area where the gate line and the data line are formed to block light by using a blocking material,
wherein the first height compensation structure includes the blocking material as at least one of one or more height providing layers of the first height compensation structure, the one or more height providing layers having respective thicknesses to compensate for height of surrounding portions of the organic layer.

13. The method of claim 12, further comprising:
using the color filter material layer to form color filters between the base substrate and the pixel electrodes by using color photo materials;
forming the gate line and the data line; and
forming a light blocking part at an area where the gate line and the data line are formed to block light using a blocking material,
wherein the first height compensation structure includes a first height providing layer having at least one of the color photo materials and a second height providing layer having the blocking material.

14. A display device comprising:
a display substrate comprising:
a plurality of color filters;
an organic layer disposed on the base substrate and disposed between a transistor and a pixel electrode which are formed on the base substrate;
a shorting pad structure comprising:
a first pad electrode including a metal layer;
a first height compensation pattern disposed on the pad electrode in a pad hole, the pad hole being formed through the organic layer; and
a second pad electrode electrically connected to the first pad electrode through a contact hole formed at an area exposed by the first compensation pattern;
a counter substrate facing the display substrate and including a common electrode; and
a conductive sealant including a conductive ball electrically connecting the shorting pad structure with the common electrode and combining the display substrate with the counter substrate.

15. The display device of claim 14, further comprising;
a column spacer maintaining a distance between the display substrate and the counter substrate; and
a second compensation pattern filling a space above the contact hole with substantially the same material as the column spacer.

16. The display device of claim 15, wherein the column spacer includes an opaque material.

17. The display device of claim 14, wherein:
the color filters are disposed between the base substrate and the pixel electrodes, and
the first height compensation pattern includes a color photo material substantially the same as used in the color filters.

18. The display device of claim 14, further comprising:
a gate line connected to a gate electrode of the transistor;
a data line crossing the gate line and connected to a source electrode of the transistor; and
a light blocking part disposed at an area where the gate line and the data line are formed to block light, wherein the first height compensation pattern includes a blocking material substantially the same as that of the blocking part.

19. The display device of claim 14, further comprising:

a gate line connected to a gate electrode of the transistor;

a data line crossing the gate line and connected to a source electrode of the transistor; and a light blocking part disposed at an area where the gate line and the data line are formed to block light, wherein the first height compensation pattern includes a color layer having a color photo material substantially the same as at least one of the color filters and a blocking layer having a blocking material substantially the same as the blocking part.

* * * * *